(12) United States Patent
Yang et al.

(10) Patent No.: US 9,166,622 B2
(45) Date of Patent: *Oct. 20, 2015

(54) PROGRAMMABLE QUASI-CYCLIC LOW-DENSITY PARITY CHECK (QC LDPC) ENCODER FOR READ CHANNEL

(71) Applicant: LSI Corporation, Milpitas, CA (US)

(72) Inventors: Shaohua Yang, San Jose, CA (US); Changyou Xu, Fremont, CA (US); Richard Rauschmayer, Longmont, CO (US); Hao Zhong, San Jose, CA (US); Weijun Tan, Longmont, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 165 days.

This patent is subject to a terminal disclaimer.

(21) Appl. No.: 13/632,768

(22) Filed: Oct. 1, 2012

(65) Prior Publication Data

US 2013/0091403 A1 Apr. 11, 2013

Related U.S. Application Data

(62) Division of application No. 12/288,221, filed on Oct. 17, 2008, now Pat. No. 8,281,214.

(51) Int. Cl.
| | |
|---|---|
| *H03M 13/00* | (2006.01) |
| *H03M 13/05* | (2006.01) |
| *H03M 13/11* | (2006.01) |
| *G06F 11/10* | (2006.01) |
| *H03M 13/27* | (2006.01) |

(52) U.S. Cl.
CPC ........... *H03M 13/05* (2013.01); *G06F 11/1008* (2013.01); *H03M 13/116* (2013.01); *H03M 13/2792* (2013.01)

(58) Field of Classification Search
CPC ..................... H03M 13/116; H03M 13/2792
USPC .................................................. 714/758, 801
See application file for complete search history.

(56) References Cited

U.S. PATENT DOCUMENTS

| | | | | |
|---|---|---|---|---|
| 5,144,573 | A * | 9/1992 | Greiner | 708/531 |
| 5,973,628 | A * | 10/1999 | McDonnell et al. | 341/67 |
| 2007/0226582 | A1* | 9/2007 | Tang et al. | 714/758 |
| 2008/0134004 | A1* | 6/2008 | Park et al. | 714/763 |

* cited by examiner

*Primary Examiner* — M. Mujtaba K Chaudry
(74) *Attorney, Agent, or Firm* — Suiter Swantz pc llo

(57) ABSTRACT

The present invention is a programmable QC LDPC encoder for encoding user data. The encoder may be configurable for implementation with a read channel. The encoder may include a plurality of barrel shifter circuits. The barrel shifter circuits are configured for generating a plurality of parity bits based on interleaved user bits received by the encoder. The barrel shifter circuits are further configured for outputting the parity bits. The encoder may further include an encoder interleaver memory. The encoder interleaver memory may be communicatively coupled with the barrel shifter circuits and may receive the parity bits output from the barrel shifter circuits. The encoder interleaver may be configured for interleaving the parity bits. Further, the encoder may be configured for outputting the interleaved parity bits to a multiplexer. The barrel shifter circuits may generate the plurality of parity bits via an encoding algorithm: $p = u * G^T$.

20 Claims, 3 Drawing Sheets

US 9,166,622 B2

PROGRAMMABLE QUASI-CYCLIC LOW-DENSITY PARITY CHECK (QC LDPC) ENCODER FOR READ CHANNEL

PRIORITY

The present application is a divisional application of U.S. patent application Ser. No. 12/288,221, filed Oct. 17, 2008, which is incorporated herein by reference.

FIELD OF THE INVENTION

The present invention relates to the field of encoder/decoder design and particularly to a system and method for providing a programmable quasi-cyclic low-density parity check (QC LDPC) encoder for a read channel.

BACKGROUND OF THE INVENTION

Currently available encoder/decoder designs may not provide a desired level of performance and/or flexibility.

Therefore, it may be desirable to provide a solution which addresses the above-referenced problems associated with current encoder/decoders.

SUMMARY OF THE INVENTION

Accordingly, an embodiment of the present invention is directed to a method for encoding, including: writing a plurality of user bits to a first interleaver memory; interleaving a first set of user bits included in the plurality of user bits via the first interleaver memory; directing a second set of user bits included in the plurality of user bits to a multiplexer; providing the interleaved user bits to an encoder; and generating parity bits based on the received interleaved user bits.

A further embodiment of the present invention is directed to a system, including: a first interleaver memory, the first interleaver memory configured for receiving a plurality of user bits, the first interleaver memory further configured for interleaving a first set of user bits included in the plurality of user bits, the first interleaver memory further configured for outputting the interleaved user bits, the first interleaver memory further configured for outputting a second set of user bits included in the plurality of user bits; an encoder, the encoder configured for being communicatively coupled with the first interleaver memory, the encoder further configured for being communicatively coupled with a second interleaver memory, the encoder further configured for receiving the interleaved user bits, the encoder further configured with a plurality of barrel shifter circuits, the plurality of barrel shifter circuits configured for generating parity bits based on the received interleaved user bits, the encoder further configured for directing the parity bits to the second interleaver memory, the second interleaver memory configured for interleaving the parity bits and for outputting the interleaved parity bits; and a multiplexer, the multiplexer configured for being communicatively coupled with the first interleaver memory, the multiplexer further configured for being communicatively coupled with the encoder, the multiplexer further configured for receiving the second set of user bits output from the first interleaver memory, the multiplexer further configured for receiving the interleaved parity bits output from the second interleaver memory, the multiplexer further configured for multiplexing the interleaved parity bits and the second set of user bits to form a multiplexer output, the multiplexer further configured for writing the multiplexer output to a storage device.

An additional embodiment of the invention is directed to an encoder for encoding user data, said encoder including: a plurality of barrel shifter circuits, the barrel shifter circuits configured for generating a plurality of parity bits based on interleaved user bits received by the encoder, the barrel shifter circuits further configured for outputting the parity bits; and an encoder interleaver memory, the encoder interleaver memory configured for being communicatively coupled with the plurality of barrel shifter circuits, the encoder interleaver memory further configured for receiving the parity bits output from the barrel shifter circuits, the encoder interleaver memory further configured for interleaving the parity bits, wherein the encoder is configured for outputting the interleaved parity bits to a multiplexer.

A further embodiment of the present invention is directed to a computer-readable medium having computer-executable instructions for performing a method for encoding, said method including: generating parity bits based on received interleaved user bits; directing the parity bits to a second interleaver memory; and interleaving the parity bits via the second interleaver memory.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
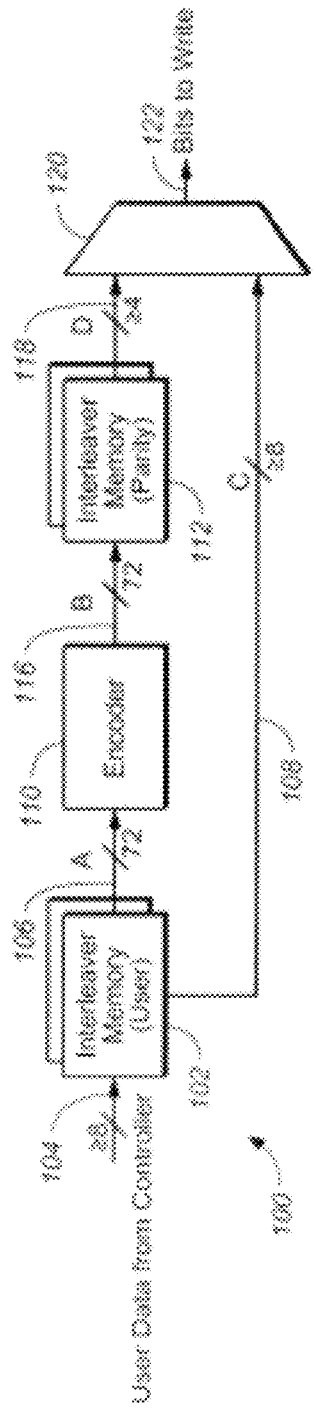
FIG. 1 is a data flow diagram for the system/encoding system of the present invention in accordance with an exemplary embodiment of the present invention.

A circulant size, p, for QC (quasi-cyclic) LDPC is determined by the structure of the parity check matrix. An embodiment of an encoder/decoder design of the present invention may be of sufficient flexibility such that said encoder may provide optimized interleaving. Further, an embodiment of an encoder/decoder design of the present invention may be Read Only Memory (ROM)/Register programmable, such that the parity check H matrix base shifts and the generator G matrix base shifts may be implemented with/put into the ROM/Register.

A first encoder design approach may include masking a parity portion of the H matrix, such that $H=[H_u, H_p]$, wherein H is the H matrix, $H_u$ is a user portion of the H matrix, and $H_p$ is a parity portion of the H matrix. In exemplary embodiments, $H_p$ (the parity portion) may be full rank/invertible (square matrix). Further, an architecture of such an encoder may be based on computation of a partial syndrome via the following equation:

$$s = H_u * u$$

wherein s is the partial syndrome, $H_u$ is the user portion of the H matrix, and u=user bit(s). Additionally, the architecture of such an encoder may be further based on computation of parity bits via the inverse matrix of $H_p$ (which would be $H_p^{-1}$). Since $H_p*p=s$, computation of said parity bits via the inverse matrix, $H_p^{-1}$, may be performed via the following equation:

$$p=H_p^{-1}*s$$

wherein p=parity bit(s), $H_p^{-1}$ is the inverse matrix, and s is the partial syndrome.

Regarding the complexity of the above-referenced first encoder design approach, the inverse matrix, $H_p^{-1}$, may be a high density quasi cyclic (QC) matrix. Further, with the above-referenced first encoder design approach, hardwiring may be implemented or computation of parity bits may be carried out via barrel shifter circuits. Regarding the programmability of the above-referenced first encoder design approach, if hardwiring is implemented, the inverse matrix, $H_p^{-1}$, may need to be fixed unless dedicated circuits are being implemented for different codes. Still further, the user portion of the H matrix, $H_u$, may be fully programmable by the barrel shifter base values. In exemplary embodiments of the present invention, the H matrix may be assumed to have a number of columns=N, a number of parity bits/checks=M, and a number of user bits=K, wherein K=N−M.

A second encoder design approach may include implementing a classic linear code encoding method using matrix [I, G] wherein I is the identity matrix and G is a non-trivial part of the generator matrix. With said second encoder design approach, parity bits may be calculated/generated via the following equation:

$$p=u*G^T$$

Regarding the complexity of the above-referenced second encoder design approach, generator matrix G may be a dense QC matrix. Further, the second encoder design approach may implement the same circuits/circuitry as the first encoder design approach if barrel shifter circuits are being implemented to generate/calculate parity bits. Regarding the programmability of the above-referenced second encoder design approach, code may be fully programmable if circulant size matches the circuit. Further, the above-referenced second encoder design approach may support QC code, even if the parity portion has masking. Further, for the generator matrix, G, the number of rows=the number of user bits, while the number of columns=the number of parity bits.

Reference will now be made in detail to the presently preferred embodiments of the invention, examples of which are illustrated in the accompanying drawings.

Referring generally to FIG. 1, a data flow diagram for a system/encoding system (ex.—for encoding user data) 100, in accordance with an exemplary embodiment of the present invention, is shown. In the illustrated embodiment, the system 100 includes a first interleaver memory 102. The first interleaver memory 102 may be configured for receiving user data (ex.—a plurality of user bits). For instance, the first interleaver memory 102 may receive the user data/user bits from a controller (said receipt of user data/user bits shown as 104). The first interleaver memory 102 may be further configured for interleaving a first set of user bits included in the plurality of user bits.

In current embodiments of the present invention, the first interleaver memory 102 may be further configured for outputting the interleaved user bits (ex.—a circulant of interleaved user bits) (said output of interleaved user bits shown as 106). In additional embodiments, the first interleaver memory 102 is further configured for outputting a second set of user bits included in the plurality of user bits (said output of the second set of user bits shown as 108).

Figure 2:
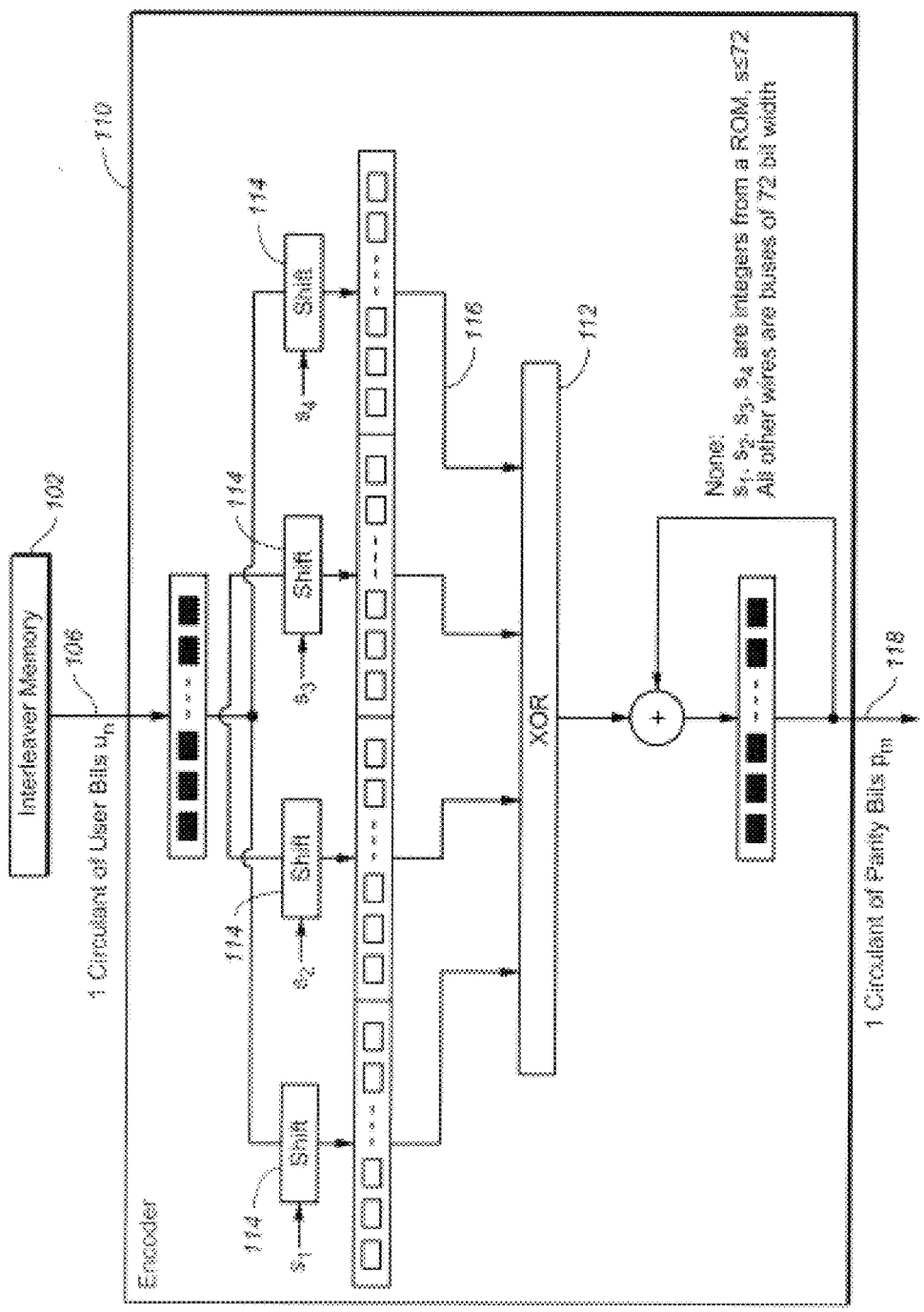
FIG. 2 is a block diagram schematic illustrating an encoding system in accordance with a further exemplary embodiment of the present invention.

In exemplary embodiments of the present invention, the system 100 may further include an encoder/decoder 110. The encoder 110 may be configured for supporting quasi cyclic (QC) code. Further, the encoder 110 may be a low-density parity-check (LDPC) encoder. Still further, the encoder 110 may be configured/configurable for implementation with a read channel. Further, the encoder 110 may be a Read Only Memory (ROM)-programmable/register-programmable encoder, such that H matrix base shifts may be implemented with/placed into the ROM/register. The encoder 110 may be configured for being communicatively coupled with the first interleaver memory 102. The encoder 110 may be further configured for being communicatively coupled with a second interleaver memory 112 (as shown in FIG. 1) and/or the encoder 110 may include/contain the second interleaver memory/encoder interleaver memory (as shown in FIG. 2). In additional embodiments, the encoder 110 may be configured for receiving the interleaved user bits (said output of interleaved user bits from the first interleaver memory 102/said receipt of the output interleaved user bits by the encoder 110 shown as 106).

In additional embodiments of the present invention, the encoder 110 may be further configured with a plurality of barrel shifter circuits 114 (ex.—four barrel shifter circuits, as shown in FIG. 2). The plurality of barrel shifter circuits 114 may be configured for generating a plurality of parity bits based on the received interleaved user bits. Further, the barrel shifter circuits 114 may also be configured for generating the parity bits via implementation of/based upon integers (ex.—shown as $s_1$, $s_2$, $s_3$ and $s_4$) received from a communicatively coupled memory (ex.—a Read Only Memory (ROM)), and/or register. For example, the integers may be H matrix base shifts. Further, the integers may be less than or equal to a circulant size p. In exemplary embodiments, the plurality of barrel shifter circuits 114 may be configured for generating the parity bits via the above-described encoder algorithm, which implements the above-described generator matrix, G $$P=u*G^T$$

An exemplary generator matrix, G, may be represented as shown below $$G = \begin{bmatrix} G_{1,1} & G_{1,2} & G_{1,3} & \ldots \\ G_{2,1} & G_{2,2} & G_{2,3} & \ldots \\ G_{3,1} & G_{3,2} & G_{3,3} & \ldots \\ G_{4,1} & G_{4,2} & G_{4,3} & \ldots \end{bmatrix}$$

Further, a basic parity bits computation unit/equation/algorithm may be:

$$p_m=u_n*G_{m,n}$$

wherein $p_m$ may be a p bit chunk/circulant of parity bits, and $u_n$ may be a p bit chunk/circulant of user bits.
Further:

$$p_1=u_1*G_{1,1}+u_2*G_{1,2}+U_3*G_{1,3}+$$

$$p_2=u_1*G_{2,1}+u_2*G_{2,2}+U_3*G_{2,3}+$$

$$p_3=u_1*G_{3,1}+u_2*G_{3,2}+U_3*G_{3,3}+$$

$$p_m=u_1*G_{m,1}+u_2*G_{m,2}+U_3*G_{m,3}+$$

As mentioned above barrel shifter circuits 114 may be implemented since $G_{m,n}$ is a quasi cyclic circulant of weight $W_{m,n}$.

In embodiments implementing four barrel shifter circuits 114, ceil ($W_{m,n}/4$) clocks may be required for computing $u_n * G_{m,n}$.

In further embodiments, the encoder 110 may be configured for directing the parity bits to the second interleaver memory 112 (directing of the parity bits to the second interleaver memory 112 shown as 116). For instance, as shown in FIG. 2, the barrel shifter circuits 114 (ex.—four of the barrel shifter circuits) may be configured for generating the parity bits (ex.—$p_1, p_2, p_3$ and $p_4$) in parallel and said parity bits may be output/transmitted in parallel to the second interleaver memory 112 (ex.—XOR as shown in FIG. 2). In embodiments of the system 100 which implement four barrel shifter circuits 114, quarter rate encoding throughput may be attained.

In exemplary embodiments, the second interleaver memory 112 may be configured for being communicatively coupled with the plurality of barrel shifter circuits 114 and may be further configured for receiving the parity bits output from the barrel shifter circuits 114. In additional embodiments, the second interleaver memory 112 may be further configured for interleaving the parity bits (ex.—such as via XOR gating circuitry) and may be further configured for outputting the interleaved parity bits (ex.—a circulant of parity bits) (said outputting of the interleaved parity bits shown as 118).

In exemplary embodiments of the present invention, the system 100 may include a multiplexer 120. The multiplexer 120 may be configured for being communicatively coupled with the first interleaver memory 102. The multiplexer 120 may be further configured for being communicatively coupled with the encoder 110. In additional embodiments, the multiplexer 120 may be further configured for receiving the second set of user bits output from the first interleaver memory 102 (outputting of the second set of user bits from the first interleaver memory 102/receipt of the second set of user bits by the multiplexer 120 shown as 108).

In current embodiments of the present invention, the multiplexer 120 may be further configured for receiving the interleaved parity bits output from the second interleaver memory 112 (outputting of the interleaved parity bits from the second interleaver memory 112/receipt of the interleaved parity bits output by the multiplexer 120 shown as 118). The multiplexer 120 may be further configured for multiplexing the received interleaved parity bits and the received second set of user bits to form/generate a multiplexer output 122. Further, the multiplexer 120 may be configured for writing the multiplexer output to a storage device/a memory (ex.—a disk).

In exemplary embodiments, the interleaved user bits and the second set of user bits may be output by/read from the first interleaver memory 102 at a speed which is a same speed at which new user data (user bits) may be received by/written to the first interleaver memory.

Figure 3:
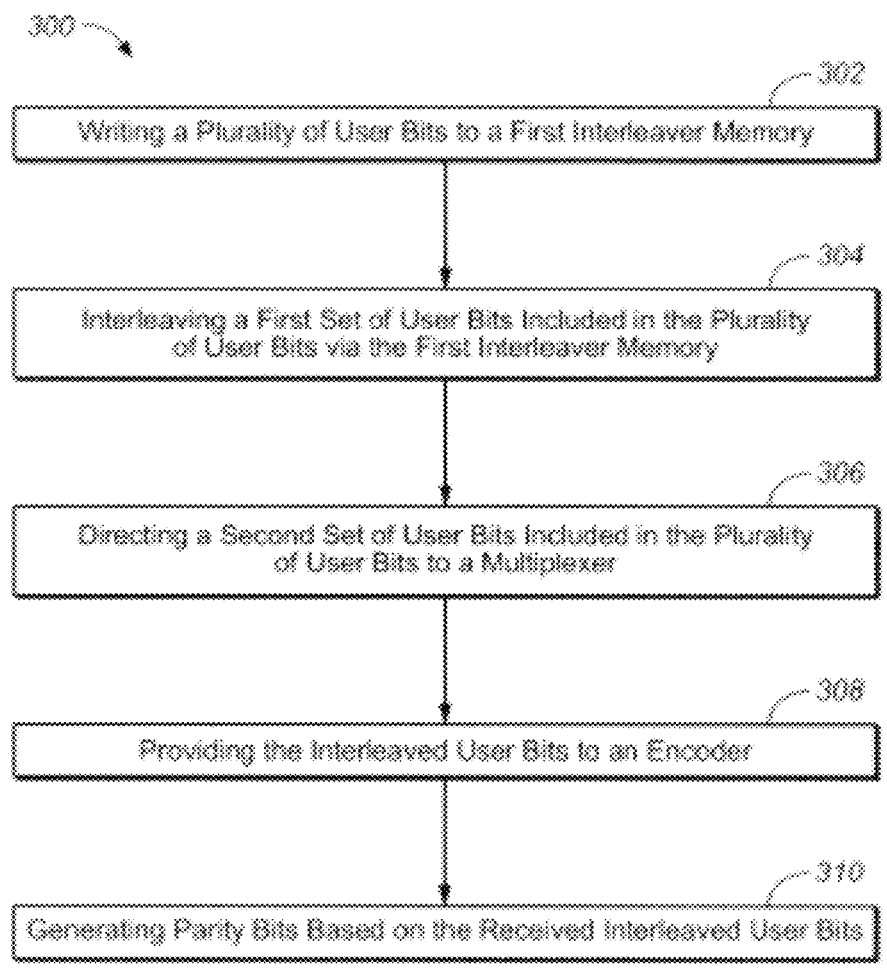
FIG. 3 is a flow chart illustrating a method for encoding in accordance with an exemplary embodiment of the present invention.

FIG. 3 is a flow diagram illustrating an exemplary method for encoding. The method 300 may include writing a plurality of user bits to a first interleaver memory 302. The method 300 may further include interleaving a first set of user bits included in the plurality of user bits via the first interleaver memory 304. The method 300 may further include directing a second set of user bits included in the plurality of user bits to a multiplexer 306. The method 300 may further include providing the interleaved user bits to an encoder 308. The method 300 may further include generating parity bits based on the received interleaved user bits 310.

In further exemplary embodiments, the method 300 may further include directing the parity bits to a second interleaver memory 312. The method 300 may further include interleaving the parity bits via the second interleaver memory 314. The method 300 may further include transmitting the interleaved parity bits to the multiplexer 316. The method 300 may further include multiplexing the interleaved parity bits and the second set of user bits to form a multiplexer output 318. The method 300 may further include writing the multiplexer output to a storage device (ex.—disk) 320. For example, the multiplexer output may include the multiplexed interleaved parity bits and the multiplexed second set of user bits. Further, the multiplexed second set of user bits/second set of user bits included in the multiplexer output may be written to the disk in a sequence, said sequence matching an order of receipt of the second user bits by the first interleaver memory 102, said order of receipt being a pre-interleaving order. For instance, the user bits included in the second set of user bits may be written to the disk in the same order (ex.—their original, pre-interleaving order) in which said bits were received by the first interleaver memory 102.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:
1. A system, comprising:
a first interleaver memory, the first interleaver memory configured for receiving a plurality of user bits, the first interleaver memory further configured for interleaving a first set of user bits included in the plurality of user bits, the first interleaver memory further configured for outputting the interleaved user bits, the first interleaver memory further configured for outputting a second set of user bits included in the plurality of user bits;

an encoder, the encoder configured for being communicatively coupled with the first interleaver memory, the encoder further configured for being communicatively coupled with a second interleaver memory, the encoder further configured for receiving the interleaved user bits, the encoder further configured with a plurality of barrel shifter circuits, the plurality of barrel shifter circuits configured for generating parity bits based on the received interleaved user bits, the encoder further configured for directing the parity bits to the second interleaver memory, the second interleaver memory configured for interleaving the parity bits and for outputting the interleaved parity bits; and a multiplexer, the multiplexer configured for being communicatively coupled with the first interleaver memory, the multiplexer further configured for being communicatively coupled with the encoder, the multiplexer further configured for receiving the second set of user bits output from the first interleaver memory, the multiplexer further configured for receiving the interleaved parity bits output from the second interleaver memory, the multiplexer further configured for multiplexing the interleaved parity bits and the second set of user bits to form a multiplexer output, the multiplexer further configured for writing the multiplexer output to a storage means.

2. The system as claimed in claim 1, wherein the plurality of barrel shifter circuits generate the parity bits in parallel.

3. The system as claimed in claim 1, wherein the plurality of barrel shifter circuits generate the parity bits via implementation of integers received from at least one of: a memory, a register, and a Read-Only memory (ROM).

4. The system as claimed in claim 1, wherein the plurality of barrel shifter circuits generate the parity bits via an algorithm: $p=u*GT$.

5. The system as claimed in claim 1, wherein the encoder is configured to generate the parity bits based on a partial syndrome (s) of a user portion ($H_u$) of a parity check matrix (H) and user bits (U) such that $s=H_u*U$.

6. The system as claimed in claim 1, wherein the encoder is configured to generate the parity bits (p) based on a partial syndrome (s) of an inverse of a parity portion ($H_p^{-1}$) of a parity check matrix (H) such that $p=H_p^{-1}*s$.

7. The system as claimed in claim 1, further comprising one or more clocks, wherein the plurality of barrel shifter circuits comprises four barrel shifter circuits and each of the barrel shifter circuits is associated with one of the one or more clocks, each of the one or more clocks configured to synchronize the barrel shifter circuits.

8. A method, comprising:
receiving a plurality of user bits with a first interleaver memory;
interleaving a first set of user bits included in the plurality of user bits with a first interleaver memory;
outputting the interleaved user bits with the first interleaver memory;
outputting a second set of user bits included in the plurality of user bits with the first interleaver memory;
receiving the interleaved user bits with an encoder comprising a plurality of barrel shifter circuits;
generating parity bits based on the received interleaved user bits with the plurality of barrel shifter circuits;
directing the parity bits to a second interleaver memory;
interleaving the parity bits with the second interleaver memory;
outputting the interleaved parity bits with the second interleaver memory;
receiving the second set of user bits output from the first interleaver memory with a multiplexer;
receiving the interleaved parity bits output from the second interleaver memory with the multiplexer;
multiplexing the interleaved parity bits and the second set of user bits to form a multiplexer output; and
writing the multiplexer output to a storage means.

9. The method as claimed in claim 8, wherein the parity bits are generated in parallel.

10. The method as claimed in claim 8, wherein the parity bits are generated via implementation of integers received from at least one of:
a memory, a register, and a Read-Only memory (ROM).

11. The method as claimed in claim 8, wherein the parity bits are generated via an algorithm: $p=u*G^T$.

12. The method as claimed in claim 8, wherein the parity bits are generated based on a partial syndrome (s) of a user portion ($H_u$) of a parity check matrix (H) and user bits (U) such that $s=H_u*U$.

13. The method as claimed in claim 8, wherein the parity bits (p) are generated based on a partial syndrome (s) of an inverse of a parity portion ($H_p^{-1}$) of a parity check matrix (H) such that $p=H_p^{-1}*s$.

14. The method as claimed in claim 8, further comprising synchronizing the plurality of barrel shifter circuits with one or more clocks.

15. A computer apparatus comprising:
a processor comprising a plurality of barrel shifters and a multiplexer;
a storage means connected to the processor;
a first interleaver memory connected to the processor;
a second interleaver memory connected to the processor; and
computer executable program code configured to instruct the processor to:
record a plurality of user bits in the first interleaver memory;
interleave a first set of user bits included in the plurality of user bits;
generate parity bits based on the interleaved user bits record the parity bits in the second interleaver memory;
interleave the parity bits;
multiplex the interleaved parity bits and a second set of user bits included in the plurality of user bits to produce a multiplexer output; and
write the multiplexer output to the storage means.

16. The apparatus as claimed in claim 15, wherein the processor is configured to generate the parity bits in parallel.

17. The apparatus as claimed in claim 15, wherein the processor is configured to generate the parity bits via implementation of integers received from at least one of: a memory, a register, and a Read-Only memory (ROM).

18. The apparatus as claimed in claim 15, wherein the processor is configured to generate the parity bits via an algorithm: $p=u*G^T$.

19. The apparatus as claimed in claim 15, wherein the processor is configured to generate the parity bits based on a partial syndrome (s) of a user portion ($H_u$) of a parity check matrix (H) and user bits (U) such that $s=H_u*U$.

20. The apparatus as claimed in claim 15, wherein the processor is configured to generate the parity bits (p) based on a partial syndrome (s) of an inverse of a parity portion ($H_p^{-1}$) of a parity check matrix (H) such that $p = H_p^{-1} * s$.

* * * * *